United States Patent [19]

Wade et al.

[11] Patent Number: 5,070,388
[45] Date of Patent: Dec. 3, 1991

[54] TRENCH-RESIDENT INTERCONNECT STRUCTURE

[75] Inventors: William R. Wade, Melbourne; Kenneth A. Ports, Indialantic, both of Fla.

[73] Assignee: Harris Corporation, Melbourne, Fla.

[21] Appl. No.: 467,590

[22] Filed: Jan. 19, 1990

[51] Int. Cl.⁵ .................... H01L 23/48; H01L 29/44; H01L 29/52; H01L 29/60

[52] U.S. Cl. ........................................ 357/68; 357/65; 357/55; 357/46

[58] Field of Search ....................... 357/68, 65, 46, 55, 357/56, 67

[56] References Cited

U.S. PATENT DOCUMENTS

| | | | |
|---|---|---|---|
| 4,324,038 | 4/1982 | Chang et al. | 29/571 |
| 4,502,069 | 2/1985 | Schuh | 357/23.4 |
| 4,711,017 | 12/1987 | Lammert | 437/20 |
| 4,903,095 | 2/1990 | Chapion | 357/23.13 |
| 4,903,108 | 2/1990 | Young et al. | 357/49 |

Primary Examiner—Rolf Hille
Assistant Examiner—David Ostrowski
Attorney, Agent, or Firm—Evenson, Wands, Edwards, Lenahan & McKeown

[57] ABSTRACT

Interconnect metal is selectively provided in a network of trenches formed in the top surface of a semiconductor substrate containing multiple circuit devices, electrical contact to regions of which is to be provided. The trench network is formed so that it intersects the device regions, thus exposing the regions at sidewalls of the trench. On the floor of the trench a bottom layer of insulator material is provided, and conductive material (such as tungsten) is deposited on or grown from the trench sidewalls, in order to electrically couple device regions to one another. Because the device interconnect employs a trench network, not only are top surface contact apertures unnecessary, but, with a device region contact (from the trench sidewall) being made along the entire width of the region, device resistance can be decreased and performance improved.

12 Claims, 2 Drawing Sheets

TRENCH-RESIDENT INTERCONNECT STRUCTURE

FIELD OF THE INVENTION

The present invention relates in general to the manufacture of semiconductor devices and is particularly directed to a scheme for interconnecting components within an integrated circuit architecture by means of a trench-resident conductive highway structure that electrically contacts sidewall portions of respective regions of the integrated circuit.

BACKGROUND OF THE INVENTION

Because of its increased radiation hardness and its use in nigh density, high performance commercial circuits, silicon on insulator (SOI) technology is currently being used in a variety of advanced integrated circuit applications. However, as device design rules continue to scale downwardly, the surface area occupied by (dielectric-filled) trenches which provide lateral isolation among the devices becomes an increasingly significant use of chip layout area. Another factor in the compactness achievable by a design layout entails first level interconnect and contact apertures. Typically, the interconnect structure involves the formation of apertures through a top surface layer of insulator material and an overlay or run (several microns or greater in length) of conductive material (e.g. metal) on the surface of the insulator between apertures. In addition, aperture size, aperture-to-aperture spacing, conductor overlap of the apertures and metal pitch rules combine to control the functional density for an entire device fabrication technology.

SUMMARY OF THE INVENTION

In accordance with the present invention the functional density of integrated circuit architectures is substantially increased by making use of a network of trenches, such as those employed for lateral isolation in SOI structures, for supporting a conductive highway for electrically interconnecting circuit devices. Pursuant to the invention, a trench is formed in the top surface of a semiconductor substrate containing multiple circuit devices, such as bipolar transistors and/or field effect transistors, electrical contact to regions (e.g. the source and drain regions of field effect transistors, or the collector regions of bipolar transistors) of which is to be provided. The trench is formed so that it intersects the device regions, thus exposing the regions at sidewalls of the trench. On the floor of the trench a bottom layer of insulator material is provided, and conductive material (such as tungsten) is deposited on or grown from the trench sidewalls, in order to conductively interconnect exposed side surfaces of device regions. Formation of the conductive interconnect within the trench to define its configuration may be effected in accordance with several techniques.

In accordance with a first embodiment, the trench is filled with conductive material, which is then selectively removed, so that the remaining conductive material conductively interconnects device regions. Alternatively, the trench may be first filled with insulator material. Insulator material is then removed from selected sidewall portions of the trench where electrical contact with device regions is to be provided. The patterned trench is thereafter filled with conductive material, thereby conductively interconnecting device regions. The trench-resident interconnect structure of the present invention also facilitates selective, controlled interconnect within three dimensional architecture. In this application, one or more apertures may be selectively formed through the trench-bottom dielectric so as to provide contact to underlying material.

In addition, regardless of the topology of the architecture with which the interconnect structure is used, the material of the interconnect need not be exclusively conductive. The interconnect layer which is selectively formed within the trench network may be at least partially highly resistive, thereby enabling passive, voltage dropping components to be incorporated within the trench for the purpose of increasing integration density.

Because the device interconnect methodology of the present invention employs a trench network, not only are top surface source and drain cōntact apertures unnecessary, but, with a device region contact (from the trench sidewall) being made along the entire width of the region, device resistance can be decreased and performance improved.

DETAILED DESCRIPTION

Figure 1:
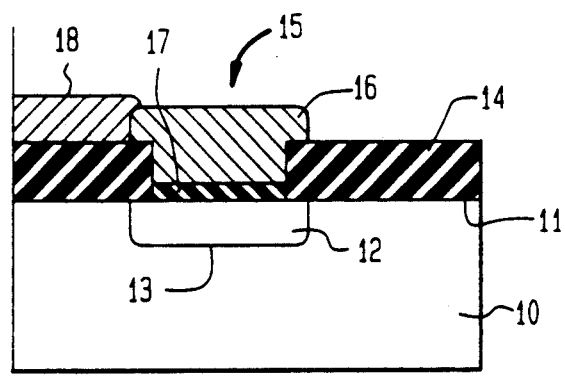
FIG. 1 is a diagrammatic cross-sectional illustration of a portion a prior art interconnect structure for an integrated circuit employing topside metallization.

As pointed out briefly above, one of the factors that determines the compactness achievable by a design layout involves first level interconnect and contact apertures. In a typical device the interconnect structure includes a contact aperture through a top surface layer of insulator material and an overlay or run (several microns or greater in length) of conductive material (e.g. metal) on the surface of the insulator between apertures. A cross-sectional illustration of a portion of such a (prior art) structure is diagrammatically illustrated in FIG. 1 as comprising a semiconductor substrate 10 from the top surface 11 of which a device region 12 extends into the substrate forming a PN junction 13 with the semiconductor material of the substrate. A layer of (field) oxide 14 disposed on surface 11 has a contact aperture 15 through which device region 12 is exposed for receiving ohmic contact metallization 16. During the formation of such a structure it is not uncommon for the exposed surface of region 13 to be contaminated with foreign matter 17, such as oxide or photoresist residue, which increases the contact resistance between metal 16 and region 13 and thereby reduces the performance of the device. Electrical connection between devices is typically realized by a conductive overlay, such as a first level of interconnect metallization 18 atop field oxide layer 14. As noted earlier, however, the contribution of aperture-to-aperture spacing, size of the contact aperture, metallic overlap of the contact apertures and metal pitch rules are significant limiting control factors in available functional density of a given integrated circuit architecture.

Figure 2:
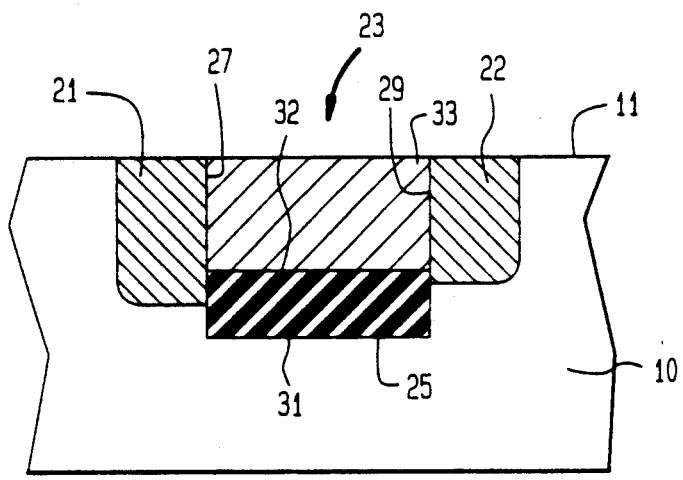
FIG. 2 is a diagrammatical cross-sectional illustration of an embodiment of the trench network interconnect architecture in accordance with the present invention.

FIG. 2 is a diagrammatical cross-sectional illustration of an embodiment of the present invention in which a pair of device regions 21 and 22 are formed in the top surface 11 of a semiconductor substrate 10. Also formed in the top surface of substrate 10 is a trench 23 defined by a floor 25 and a pair of sidewalls 27 and 29 which extend from top surface 11 to floor 25 and intersect regions 21 and 22, respectively, thereby exposing side surface portions of each of regions 21 and 22. Trench 23 may be formed in accordance with current fabrication process techniques, such as those for silicon-on-insulator structures. Typical, but not limitative, depth and width values of trench 23 are 1 micron by 1 micron, so that, where lateral isolation is desired, the trench has sufficient size to accommodate requisite dielectric material and to ensure a copious surface contact area with the sidewalls of the device regions for minimizing contact resistance.

To minimize substrate leakage (extensions of the depletion regions from the PN junctions formed between the device regions and the substrate), a dielectric layer 31 is formed on the trench floor 25. The remainder of the trench is then filled a conductor layer 33 (e.g. by depositing or growing a layer of metal such as tungsten) in intimate contact with sidewalls 27 and 29, so that conductor layer 33 is electrically and physically contiguous with regions 21 and 22 that are intersected by the trench. The parameters (e.g. depth, thickness) of trench 23 and dielectric layer 31 are preferably such that the top surface 32 of dielectric layer 31 intersects regions 21 and 22. Tailoring the thickness of dielectric layer 31 in this manner ensures that any junctions between regions 21, 22 and adjacent semiconductor material (substrate 10) terminate at or intersect dielectric layer 31, thereby preventing conductor layer 33 from shorting regions 21, 22 and the adjacent semiconductor material.

Although the cross-sectional illustration of FIG. 2 shows regions 21 and 22 diametrically opposed to one another so as to be 'face-to-face' as a result of the formation of trench 23, and thereby effectively 'bridged' by conductor layer 33, it should be observed that regions 21 and 22 may be spaced apart from one another 'along' the trench so that they are not diametrically opposed in such a 'face-to-face' configuration. Indeed, the device regions may be formed along the same sidewall of the trench or separate portions of a trench network comprised of successive, contiguous trench segments, as diagrammatically illustrated in the plan view of the trench topology architecture of FIG. 3.

Figure 3:
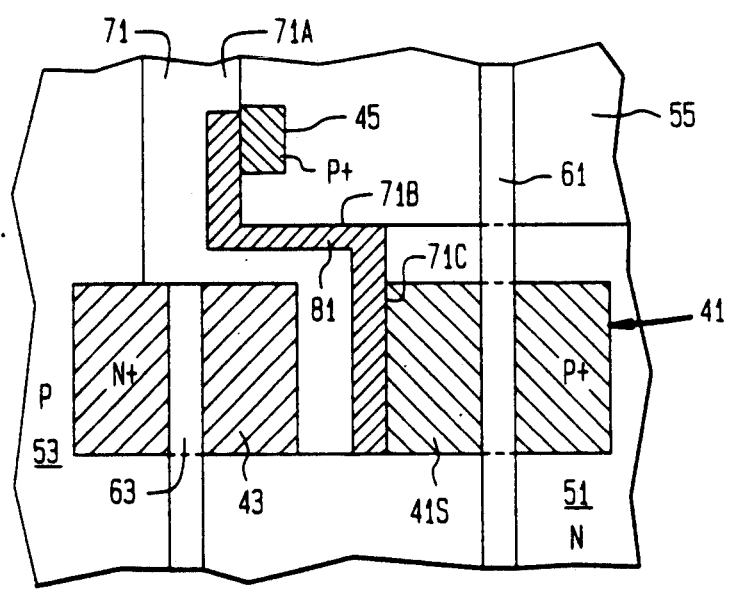
FIG. 3 is a plan or top view of a CMOS semiconductor topology showing a trench network interconnect structure in which device regions are formed along the same sidewall of the trench and separate portions of the trench network.

More particularly, as shown in FIG. 3, a representative CMOS topology is depicted as comprising respective P+ and N+ source/drain pairs 41, 43 formed in N and P isolated substrate islands 51, 53. The source/drain pairs are self-aligned with polysilicon gates 61, 63 that extend over a layer of topside dielectric. Islands 51 and 53 are separated from one another and from a further device-resident island 55 by trench network 71, respective segments 71A and 71C of which intersect the device regions of the islands and thereby expose these regions along sidewall portions of the trench segments, as in the case of the diagrammatic cross-sectional illustration of FIG. 2, referenced above.

FIG. 3 also shows the selective filling of the trench network with a rectilinear 'S'-shaped layer of conductive material 81 for the purpose of electrically interconnecting source region 41S of N channel MOSFET island 51 with a region 45 in island 55. If CMOS islands 51 and 53 were employed to configure a complementary inverter structure, with the output connected to a region in another island, such as region 45 in island 55, conductor material could be deposited or grown in trench segment 71C between islands 51 and 53, so as to effectively bridge adjacent complementary source/drain regions 43 and 41.

Figure 4:
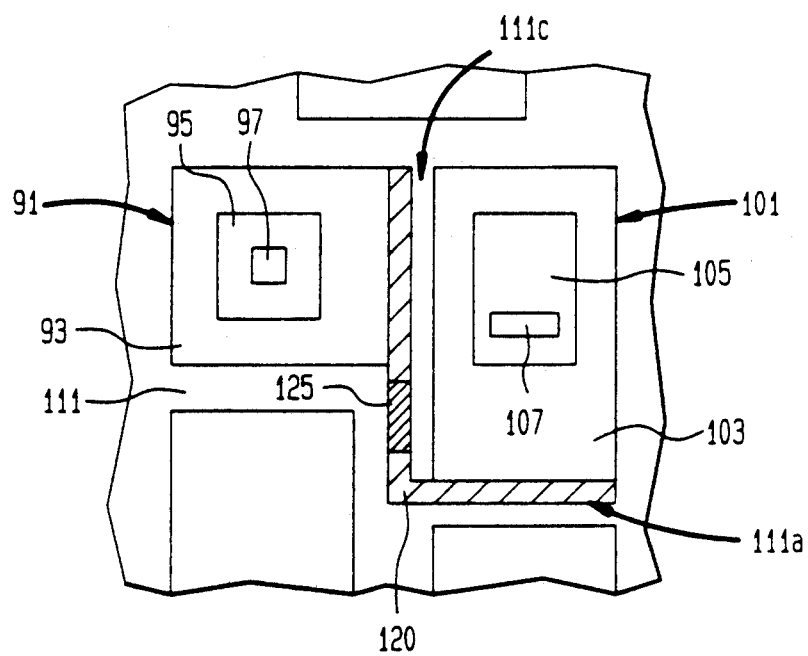
FIGS. 4 and 5 are respective plan views of bipolar semiconductor topologies having a trench network interconnect structure.

It should be observed that the present invention is not limited to use with a specific type of integrated circuit or device, such as the CMOS field effect configuration shown in FIG. 3, but may be incorporated within other circuit applications. For example, the topology of a representative bipolar transistor architecture, illustrated in FIG. 4 as comprising a pair of adjacent transistors 91, 101, contains a trench network 111 that delineates the sidewalls of collectors 93 and 103 of transistors 91 and 101, respectively. Base and emitter regions 95, 97 are formed within collector region 93, while base and emitter regions 95, 97 are formed within collector region 103. Respective segments 111A and 111C of trench network 111 intersect the collector regions 93, 103 and thereby expose these regions along sidewall portions of the trench segments, as diagrammatically illustrated in FIG. 2, referenced above. As in the embodiment of FIG. 3, trench network 111 may be selectively filled with a rectilinear 'S'-shaped layer of conductive material 120 for the purpose of electrically interconnecting the transistors. In the illustration of FIG. 4 layer 120 is selectively formed in trench network 111 so as to connect collector region 103 of transistor 101 with collector region 83 of transistor 81.

Figure 5:
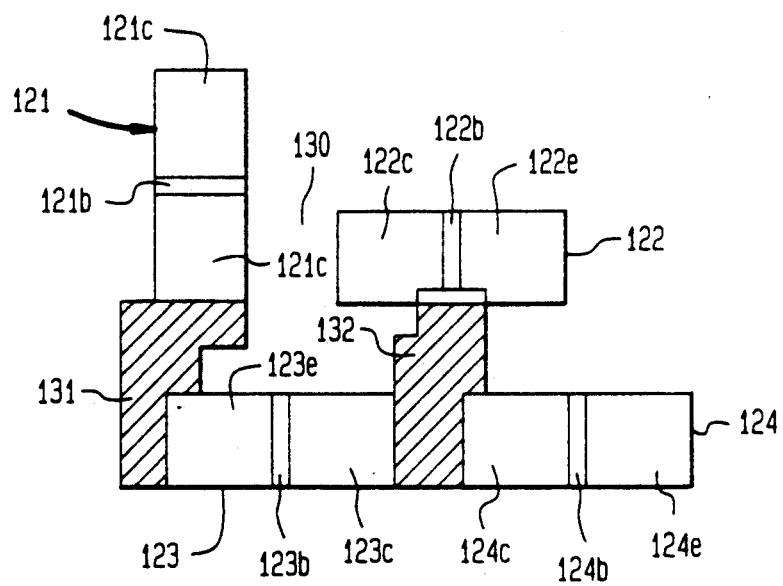

FIG. 5 shows another bipolar circuit topology, in which the base region (121b, 122b, 123b, 124b) of each of a plurality of transistor islands 121, 122, 123, 124, isolated from one another by trench network 130, laterally separates its collector region (121c, 122c, 123c, 124c) and emitter regions (121e, 122e, 123e, 124e). Similar to the bipolar architecture of FIG. 4, trench network 130 may be selectively filled with segments 131, 132 of conductive material, so as to electrically interconnect prescribed regions of the transistor islands, each of which is exposed by the sidewalls of the trench.

In each of the above embodiments, selective formation of interconnect material may be accomplished in accordance with a number of alternative embodiments. For example, after the formation of a bottom layer of insulator on the floor of the trench, the entirety of the trench may be filled with interconnect metal (e.g. tungsten), which is thereafter photolithographically patterned, to leave trench regions filled, partially filled or devoid of metal as necessary. Thereafter, (dielectric) refill of the trench, planarization and subsequent device processing steps are carried out as in conventional wafer processing. Alternatively, rather than form the interconnect metal first, the trench may be initially filled with dielectric (for example by a non-selective oxidation of the trench sidewalls followed by a non-selective dielectric deposition and planarization procedure). The sidewall oxide is then etched away in selected regions where interconnect contact is to be effected. Interconnect metal may then be deposited or grown in the etched away areas of the trench oxide to fill the trench selectively, so that a subsequent metal patterning step is not required.

Figure 6:
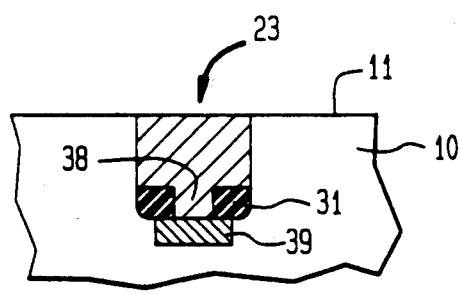
FIG. 6 diagrammatically shows the formation of an aperture in a dielectric layer at the bottom of the trench to provide contact to underlying material.

The trench-resident interconnect structure of the present invention also facilitates selective, controlled interconnect within three dimensional architectures (circuit devices arranged vertically as well as horizontally in the substrate). In this application, an aperture 38 may be selectively formed through dielectric layer 31 at the bottom of the trench to provide contact to underlying material, such as a device region 39, as diagrammatically illustrated in FIG. 6.

In addition, regardless of the topology of the architecture with which the interconnect structure is used, the material of the interconnect need not be exclusively conductive. The interconnect layer which is selectively formed within the trench network may be at least partially highly resistive, as shown at region 125 in FIG. 5 for example, thereby enabling passive, voltage dropping components to be incorporated within the trench for the purpose of increasing integration density.

Regardless of the methodology chosen for selectively forming interconnect within the trench network or "map", because topside contacts to source and drain regions are effectively eliminated, the resulting integrated circuit architecture enjoys improved functional density and thereby enhanced speed and performance. With contact to a device region (e.g. source or drain) being possible along the entirety of its side surface, device resistance can be decreased. The improved integration and reduced resistance is particularly noteworthy in a CMOS architecture, such as a CMOS inverter pair, where conductive bridging of adjacent P and N source/drain regions may be readily accomplished by forming the trench such that it exposes opposing side faces of the P and N regions and filling that portion of the trench between the regions with interconnect metal which is contiguous with each sideface. In the topology diagrammatically illustrated in FIG. 3, therefore, adjacent source/drain regions of opposite conductivity type islands 41 and 43 that are intersected by trench portion 71C may be conductively bridged by forming a bottom layer of dielectric material and then filling that portion of the trench with metal (e.g. tungsten).

As will be appreciated from the foregoing description, pursuant to the present invention the functional density of integrated circuit architectures is substantially increased by making use of a network of trenches, such as those employed for lateral isolation in SOI structures, for supporting a conductive highway for electrically interconnecting circuit devices. Because the device interconnect methodology of the present invention employs a trench network, not only are top surface source and drain contact apertures unnecessary, but, with a device region contact (from the trench sidewall) being made along the entire width of the region, device resistance can be decreased and performance improved.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed:

1. An integrated circuit architecture for supporting a plurality of field effect devices therein comprising:

a semiconductor substrate having a plurality of field effect devices in spaced apart surface portions thereof, each field effect device including source and drain regions and a gate therebetween;

a trench formed in said substrate so that said trench intersects source and drain regions of said field effect devices and thereby exposes source and drain regions at sidewalls of said trench; and conductive material disposed in said trench in contact with the entirety of the width of source and drain regions exposed at the sidewalls of said trench.

2. An integrated circuit architecture according to claim 1, further including an insulator layer disposed on the bottom of said trench beneath said conductive material.

3. In a semiconductor on insulator integrated circuit architecture, including a semiconductor substrate having a buried insulator layer separating said substrate into an upper body portion and a lower body portion, said upper body portion containing a plurality of field effect devices, each of which has source and drain regions and a gate therebetween, and conductive material for providing electrical contact with source and drain regions of said devices, the improvement comprising a trench formed in the upper body portion of said substrate so that said trench intersects source and drain regions of said field effect devices and thereby exposes source and drain regions at sidewalls of said trench, and wherein said conductive material is disposed in said trench in contact with source and drain regions exposed at the sidewalls of said trench.

4. The improvement according to claim 3, wherein said trench includes an insulator layer disposed on the bottom of said trench beneath said conductive material.

5. The improvement according to claim 1, wherein each of said field effect semiconductor devices includes lateral isolation material extending from spaced apart surface portions of said upper body portion to said buried insulator layer.

6. An integrated circuit structure comprising:

a semiconductor substrate having a plurality of circuit devices formed in respective spaced apart surface portions thereof, each of said circuit devices including at least one semiconductor region therein;

a trench formed in said substrate so that said trench intersects semiconductor regions of plural ones of said circuit devices and thereby exposes said semiconductor regions at sidewalls of said trench; and conductive material formed in said trench in contact with sidewalls thereof so as to electrically interconnect semiconductor regions of plural ones of said circuit devices.

7. An semiconductor integrated circuit structure according to claim 6, further including an insulator layer disposed on the bottom of said trench beneath said conductive material.

8. An integrated circuit structure according to claim 7, wherein said insulator layer is formed in said trench such that an interface between a semiconductor region and adjacent semiconductor material intersects said insulator layer in said trench, and said conductive material is formed on said insulator layer in said trench so as to electrically interconnect semiconductor regions of plural circuit devices.

9. An integrated circuit structure according to claim 8, wherein said conductive material includes regions of differing resistivity.

10. An integrated circuit structure according to claim 6, wherein said insulator layer has an aperture therethrough exposing material at the bottom of said trench, and said conductive material electrically couples a semiconductor region of a circuit device to the material exposed through the aperture in said insulator layer.

11. An integrated circuit architecture for supporting a plurality of bipolar transistors therein comprising:

a semiconductor substrate having a plurality of bipolar transistors in spaced apart surface portions thereof, each bipolar transistor including collector, base and emitter regions;

a trench formed in said substrate so that said trench intersects regions of plural ones of said bipolar transistors and thereby exposes plural regions at sidewalls of said trench: and conductive material disposed in said trench in contact with prescribed ones of said plural regions exposed at the sidewalls of said trench.

12. An integrated circuit architecture according to claim 11, further including an insulator layer disposed on the bottom of said trench beneath said conductive material.

* * * * *